United States Patent [19]
Saito et al.

[11] Patent Number: 5,334,542
[45] Date of Patent: Aug. 2, 1994

[54] METHOD OF FORMING T-SHAPED ELECTRODE

[75] Inventors: Tadashi Saito; Kazuyuki Inokuchi, both of Tokyo, Japan

[73] Assignee: Oki Electric Industry Co., Ltd., Tokyo, Japan

[21] Appl. No.: 978,280

[22] Filed: Nov. 18, 1992

[30] Foreign Application Priority Data

Nov. 27, 1991 [JP] Japan .................. 3-312821

[51] Int. Cl.$^5$ .......................... H01L 21/265
[52] U.S. Cl. ........................ 437/40; 437/41; 437/44; 437/183; 437/184; 437/203
[58] Field of Search ............ 437/40, 44, 45, 183, 437/184, 203, 41

[56] References Cited
U.S. PATENT DOCUMENTS

| | | | |
|---|---|---|---|
| 4,334,349 | 6/1982 | Aoyama et al. | 437/183 |
| 4,959,326 | 9/1990 | Roman et al. | 437/40 |
| 4,975,382 | 12/1990 | Takasugi | 437/40 |
| 4,997,778 | 3/1991 | Sim et al. | 437/44 |
| 5,053,348 | 10/1991 | Mishra et al. | 637/41 |
| 5,155,053 | 10/1992 | Atkinson | 437/184 |

OTHER PUBLICATIONS

"Technical Report ED90-86-92", Association of Electronic Date Communication, pp. 37–43 (translation attached).
H. Jinbo et al, "0.2 μM or less i-Line Lithography by Phase-Shifting-Mask Technology", *1990 IEDM Technical Digest*, p. 33.3.1 (pp. 825–828).
T. Shino et al, "Super Low Noise AlGaAs/GaAs HEMT with One Tenth Micron Gate", *1989 IEEE MTT-S Digest*, pp. 423–426.

*Primary Examiner*—Brian E. Hearn
*Assistant Examiner*—Kevin M. Picardat
*Attorney, Agent, or Firm*—Spencer, Frank & Schneider

[57] ABSTRACT

A lower mask layer and a first resist layer are formed on a substrate. The first resister is exposed with the use of an exposure mask having a phase shifter. A part of the first resist layer corresponding to the edge of the phase shifter becomes an unexposed part so that an aperture in slit is formed in the first resist layer by developing. The first mask layer is etched through said first resist layer to form an aperture for forming a gate electrode. A second resist layer as an upper mask layer is formed over the lower mask layer. The second resist layer is exposed with the use of the same exposure mask, and is then developed. By setting the exposure strength to a value lower than an exposure strength for exposure to the first resist layer, a wider aperture is formed in the second resist layer. With the use of the lower mask layer having the narrower aperture and the upper mask layer having the wider upper mask layer, a T-shape electrode is formed.

11 Claims, 7 Drawing Sheets

METHOD OF FORMING T-SHAPED ELECTRODE

FIELD OF THE INVENTION

The present invention relates to a method of forming a T-shaped electrode.

BACKGROUND OF THE INVENTION

Microwave FETs including MESFETs, HEMFETs and the like used in a microwave circuit have a need to have a short gate length in order to suppress noise. However, should the gate length be shorter, the gate resistance would become higher, and accordingly, it is very difficult to suppress noise in a microwave FET. Accordingly, a gate electrode having a T-like cross-sectional shape, which can provide not only with shortened gate length, but also a reduced gate resistance has been proposed. For example, TECHNICAL REPORT ED-90-86-92 published by the Association of Electronic Data Communication, pages 37 to 43, discloses a conventional method of forming T-shaped gate electrode.

FIGS. 6A to 6D are sectional views for explaining the process steps for forming a conventional T-shape electrode, disclosed in the above-mentioned document.

Figure 6A:
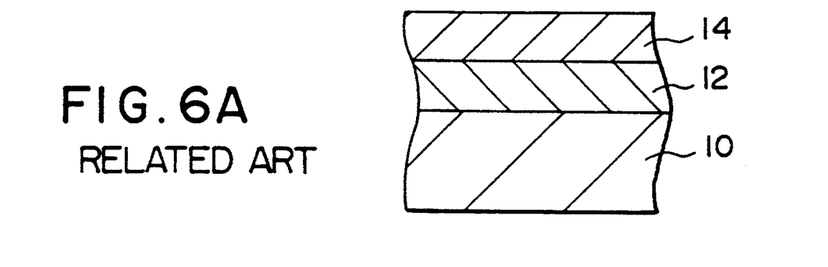
FIGS. 6A to 6D are sectional views illustrating a conventional T-shaped electrode forming method, respectively.

In the conventional forming method, at first, as shown in FIG. 6A, a lower resist layer 12 having a low sensitivity and a high resolution, and an upper resist layer 14 having a high sensitivity are successively formed on a GaAs substrate 10, successively.

Figure 6B:
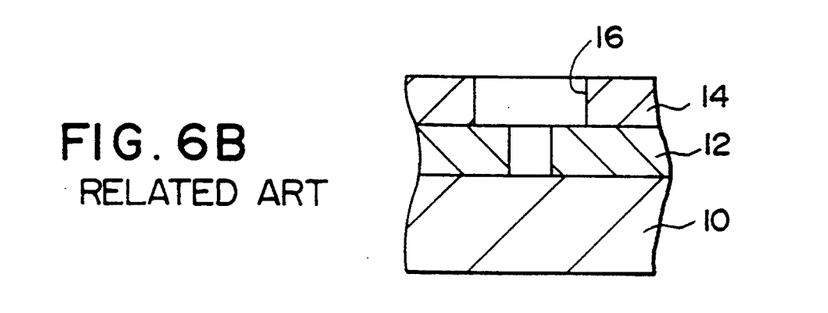

Then, as shown in FIG. 6B, the upper and lower resist layers 14, 12 are exposed by an electron beam type direct plotting apparatus, and thereafter, they are developed to form an aperture 16 for exposing a surface of the GaAs substrate 10 through the resist layers 14, 12. The upper resist layer 14 is dissolved by a developer to a greater extent in comparison with lower resist layer 12 even though both upper and lower resist layers 14, 12 are exposed at an equal exposure value, and accordingly, the aperture 16 having a T-like cross-sectional shape can be formed.

Figure 6C:
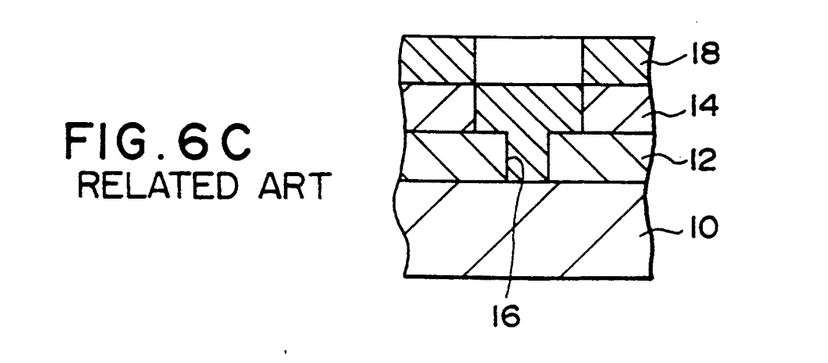

Next, as shown in FIG. 6C, a material layer 18 for forming a gate electrode is deposited on the surface of the substrate 10 and the lower resist layer 12 which are exposed through the aperture 16.

Figure 6D:
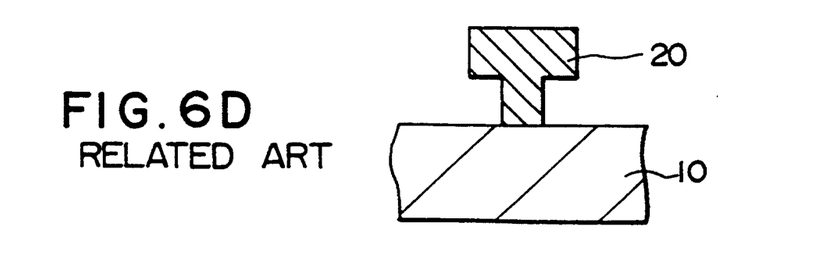

Further, as shown in FIG. 6D, the upper and lower resist layers 12, 14 are removed to obtain a gate electrode 20 having a T-like cross-sectional shape. The gate length can be effectively shorten by narrowing the width of the base part of the gate electrode 20, and further, the resistance of the gate electrode 20 can be reduced by widening the width of the head part of the gate electrode.

However, since the electron beam type direct plotting apparatus scans a resist layer with an electron beam to depict the shape of a gate electrode for exposure of the resist layer, a long time is consumed for depicting the gate electrode, causing a lowering of productivity.

SUMMARY OF THE INVENTION

Accordingly, in order to solve the above-mentioned problems inherent to the conventional method, one object of the present invention is to provide a method of forming a T-shaped electrode, in particular, a T-shaped gate electrode with the use of a projection exposure process. In order to achieve the above-mentioned object, a T-shaped electrode forming method is, according to the present invention, characterized by the steps of:

forming a lower mask layer for forming an electrode over a substrate;

applying a first resist layer of a negative type over the lower mask layer, exposing the first resist layer with the use of an exposure mask incorporating a phase shifter having an edge to form a first unexposed part in fine line corresponding to the edge of the phase shifter, on the first resist layer, developing the first resist layer to remove the first unexposed part in order to form a first resist pattern, etching the lower mask layer through the first resist pattern to form a slit an aperture in slit for exposing the substrate in the lower mask layer, removing the first resist pattern, and applying a second resist layer of a negative type over the lower mask layer in which the aperture has been formed, exposing the second resist layer with the use of the exposure mask at an exposure value which is less than that used for the first resist layer, to form a second unexposed part in fine line which is laid above the aperture and which is wider than the aperture, in the second resist layer, developing the second resist layer to remove the second unexposed part in order to form a second resist pattern as an upper layer mask for foraging an electrode, and laminating an electrode material on the substrate through the upper and lower mask layers, and thereafter, removing the upper and lower mask layers.

The phase of light transmitted through the above-mentioned phase shifter on the exposure mask according to the present invention differs from that of light not transmitted therethrough by about 180 degrees. By the projection exposure of a negative type resist layer with the use of this exposure mask, the intensity of light irradiated onto a part of the negative resist layer which corresponds to the edge of the phase shifter (which will be denoted as the edge corresponding pan) is weakened due to the interference of light.

Accordingly, since the exposure of the edge corresponding part can be regulated to a degree such that the edge corresponding part does not lose its behavior with which it can be dissolved by the developer, an unexposed part which has not been substantially exposed can be formed in the edge corresponding part. Further, an unexposed part having an extremely narrow width is formed in the edge corresponding part. That is, an unexposed part having a width of less than 0.25 μm can be formed although this numerical value is not absolutely essential. Further, the width (area) of the unexposed part formed in the edge corresponding part can be controlled by an exposure value. The larger the exposure value, the smaller the width of the unexposed part becomes, that is, the smaller the exposure value, the larger the width of the unexposed part becomes. Accordingly, even though the first and second resist layers are exposed by a common exposure mask, the width of an unexposed part formed on the second resist layer can be made to be wider than that of an exposed part formed on the first resist layer by controlling the exposure value.

DESCRIPTION OF THE PREFERRED EMBODIMENT

Explanation will be made hereinbelow of one embodiment form of the present invention. In this embodiment, the simultaneous formation of both T-shaped gate electrode and a gate electrode pad is exemplified.

In this embodiment, in addition to an exposure mask (or a first exposure mask) incorporating thereon a phase shifter for forming the plan view shape of the T-shaped electrode into a desired pattern for a T-like cross-sectional shape gate electrode, another exposure mask (or a second exposure mask) incorporating a light shield part at a position corresponding to an electrode pattern part on the edge of the phase shifter and a light transmission part at a position corresponding to a non-electrode pattern part on the edge of the phase shifter is also used.

Figure 1A:
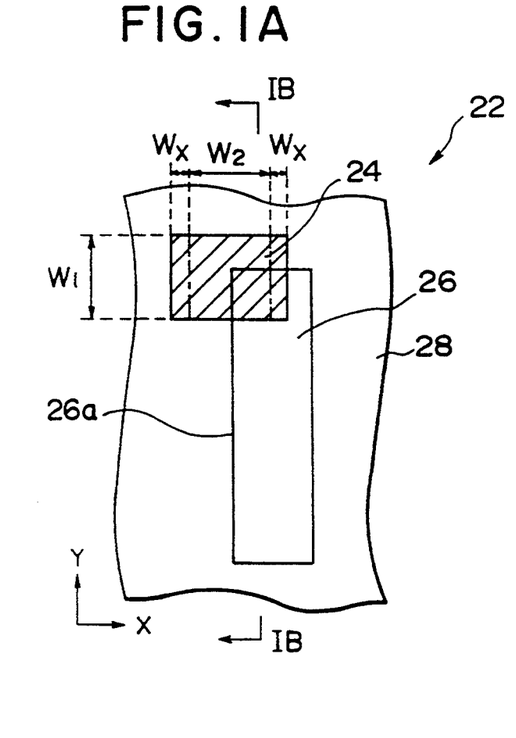
FIGS. 1A and 1B are plan and sectional views illustrating a first exposure mask used for forming a T-shaped electrode according to the present invention, respectively.
Figure 1B:
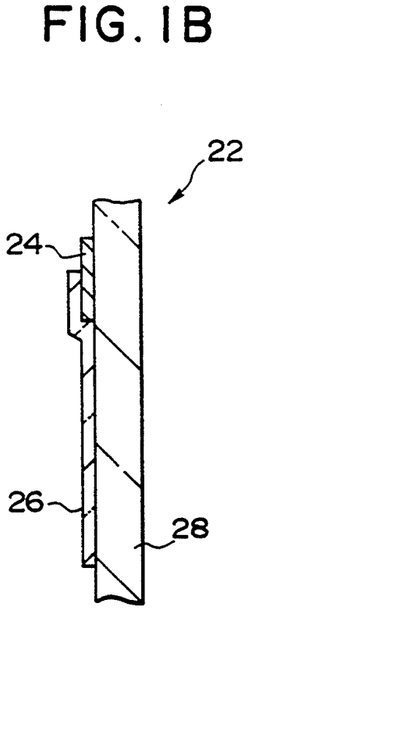

FIG. 1A is a plan view illustrating the general configuration of the first exposure mask used in this embodiment, and FIG. 1B is a sectional view taken along Line IB—IB in FIG. 1A. The first exposure mask 22 is formed by arranging on a light transmission section 28 in a first light transmissive substrate both a first light shield part 24 used for forming a gate electrode pad and a phase shifter 26 used for forming a T-shaped gate electrode. The edge 26a of phase shifter 26 is extended into an area on the light transmission section 28 where the first light shield part 24 is not provided.

The plan view shape of the first shield part 24 is rectangular. A first side extending in the Y-axis direction has a length $W_1$ and a second side extending in the X-axis direction orthogonal to the first side has a length $(W_2+2W_X)$, where $W_1$ is a value which is obtained by multiplying an absolute size of a side of the gate electrode pad extending in the X-axis direction on design, with the reciprocal of a reduction ratio t given by a projection exposure apparatus, and $W_2$ is a value which is obtained by multiplying an absolute size of a side of the gate electrode pad extending in the Y-axis direction, with the reciprocal of the reduction ratio t given by the projection exposure apparatus.

Further, $W_X$ is an estimated positional shift in the X-axial direction between the first exposure mask 22 and a second exposure mask 30, which will be described later. That is, the left end of the first light shield part 24 is spaced from a position corresponding to the position of the left end of the gate electrode pad on the first exposure mask 22, by $W_X$ in the X-axis direction in FIG. 1A. Further, the fight end of the first shield part 24 is spaced from a position corresponding to the fight end of the gate electrode pad on the first exposure mask 22, by $W_X$ in the X-axis direction in FIG. 1A.

Figure 2A:
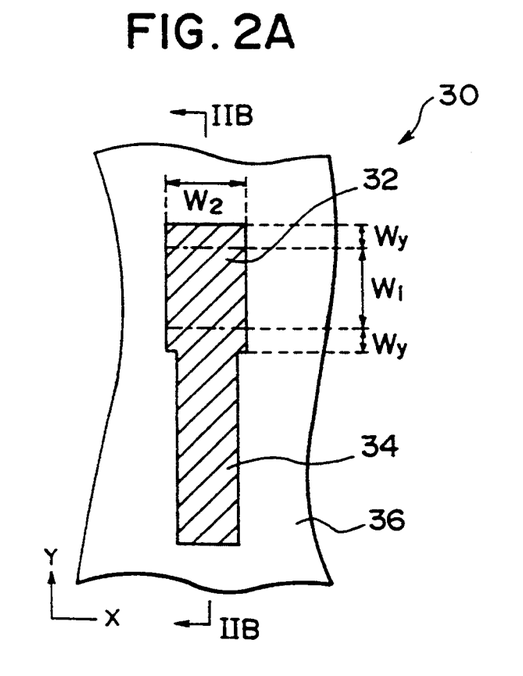
FIGS. 2A and 2B are plan and sectional views illustrating a second exposure mask used for forming a T-shaped electrode, respectively.
Figure 2B:
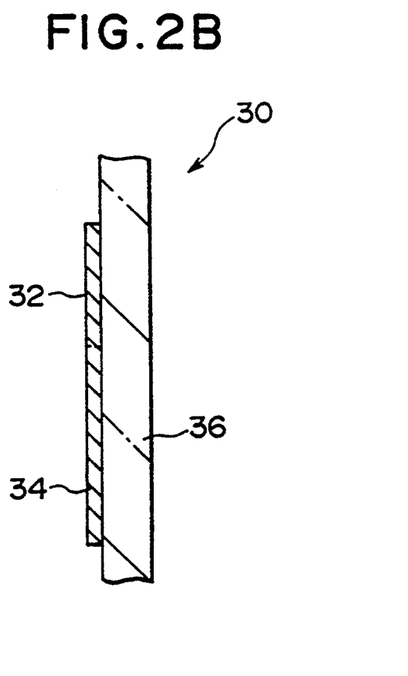

FIG. 2A is a plan view showing the general construction of the second exposure mask, and FIG. 2B is a sectional view taken along line IIB—IIB. The second exposure mask 30 in this embodiment is formed by arranging on a second light transmission part 36 in a second light transmissive substrate a second light shield part 32 for forming a gate electrode pad, and a third light shield part 34 for forming a T-shaped gate electrode. The second light shield part 32 is located at a position corresponding to the first light shield part 24 on the first light exposure mask 22, and the third light shield part 34 is located at a position corresponding to the gate electrode pattern part on the edge 26a of the first exposure mask 22, these light shield parts 32, 34 being connected together. Further, an area in the light transmission part 36, where the second and third light shield parts 32, 34 are not present is provided at a position corresponding to the non-electrode pattern part on the edge 26a of the first exposure mask 22.

The plan view shape of the second light shield part 32 is rectangular. A second side of this light shield part 32, extending in the X-axis direction, has a length $W_2$ and a first side thereof extending in the Y-axis direction orthogonal to the second side has a length $(W_1+2W_Y)$ where $W_Y$ is an estimated positional shift in the Y-axis direction between the first exposure mask 22 and the second exposure mask 30. That is, the upper end of the second light shield part 32 is spaced from the position corresponding to the upper end of the gate electrode pad on the second exposure mask 30 by $W_Y$ in the Y-axis direction as shown in FIG. 2A. Further, the lower end of the second light shield pan 32 is shifted from the position corresponding to the lower end of the gate electrode pad on the second exposure mask 32 on the second exposure mask 30 by $W_Y$.

Next, explanation will be made of an unexposed part (latent image) formed in a resist layer through twice exposures with the use of the first and second exposure masks 22, 30.

Figure 3A:
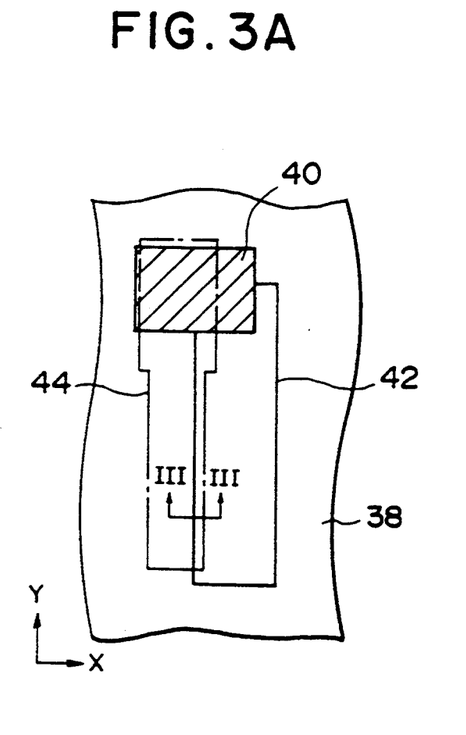
FIGS. 3A and 3B are plan views illustrating an unexposed part on a resist layer after exposure with the use of the first and second exposure mask, respectively.
Figure 3B:
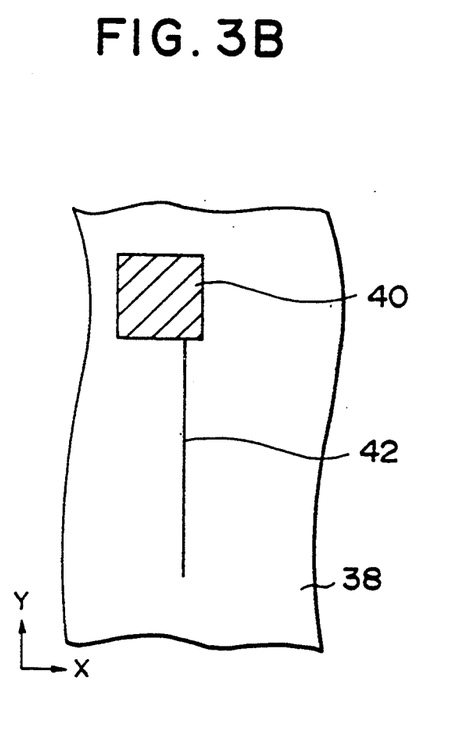

Consideration is made of such a case that the resist layer is exposed with the use of the first exposure mask 22 (first exposure), and then, is exposed by the second exposure mask 30 (second exposure). FIGS. 3A and 3B show a plan view illustrating the unexposed part formed in the resist layer through the first and second exposures.

As shown in FIG. 3A, through the first exposure, a light shield part 40 for forming a pad is formed in a part of the resist layer 38 corresponding to the first light shield part 24 while an exposed part 42 for forming a gate electrode is formed in a part of the resist layer 38 corresponding to the edge of the phase shifter 26.

After the first exposure, the second exposure mask 30 is set to carry out the second exposure. At this stage, as shown in FIG. 3A, for example, the second exposure mask 30 is set to be shifted in the X-axial direction in such a way that the left side of the second light shield part 32 on the second exposure mask 30 is superposed with the left side of the first light shield part 24 on the first exposure mask 22. A light shield area 44 which is formed on the resist layer 38 by the second and third light shield parts 32, 34 on the second exposure mask 30 is shown in FIG. 3A. In this case, since the estimated positional shift upon the mask setting is considered in the widths in the X-axial direction of the second and third light shield parts 32, 34 on the second exposure mask 30, the nonelectrode pattern part is exposed while the gate electrode pattern part in the unexposed part 42 for forming the gate electrode is prevented from being exposed during the second exposure, as shown in FIG. 3B. Further, the lengths of sides of the unexposed electrode pattern part for forming the pad, which extend in the X- and Y-axial directions, can be set to predetermined designed sizes ($W_1 \times t$) and ($W_2 \times t$). Even though twice exposures are carried out by using the second and first exposure masks 30, 22 in the mentioned order, the unexposed parts 40, 42 having patterns similar to those shown in FIG. 3B can be formed. In this embodiment, a gate electrode pad and a gate electrode having plan view shapes equivalent to, for example, those of the unexposed parts 40, 42 shown in FIG. 3B are formed by the two exposures using the first exposure mask 22 and the second exposure mask 30.

Explanation has been made of such an example that the position of the mask is shifted in the X-axial direction as shown in FIGS. 3A, 3B upon setting of the first and second exposure masks 22, 30. However, even though the position of the mask is shifted in either of the X- and Y-axial directions, an unexposed part having an area and a shape the same as those of the unexposed part 40 shown in FIG. 3B can be formed.

Next, explanation will be made of the process steps for forming a T-shaped electrode and a gate electrode pad with the use of the first and second exposure masks 22 and 30. FIGS. 4A to 4L are sectional views along line III—III in FIG. 3A, for explaining these process steps which are particularly directed to the formation of the T-shaped gate electrode.

Figure 4A:
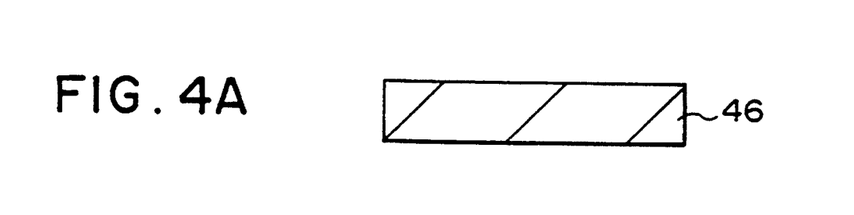
FIGS. 4A to 4L are sectional views for explaining the process of forming a T-shaped electrode according to the present invention, respectively.

First, a substrate 46 on which a T-shaped gate electrode is to be formed is prepared, as shown in FIG. 4A. In this embodiment, the substrate 46 incorporates an active layer (which is not shown) for a field-effect transistor, and further incorporates a source electrode (ohmic electrode) and a drain electrode (ohmic electrode) formed on the active layer although they are also not shown.

Figure 4B:
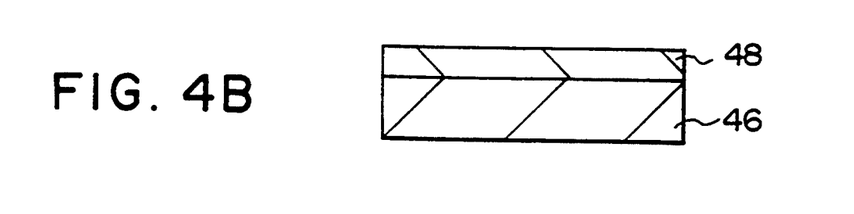

Next, as shown in FIG. 4B, an SiN film having a thickness of about 1,000 Å is formed as a lower mask layer 48 on the substrate 46 by using, for example, a plasma chemical vapor deposition (PCVD) process.

A film other than the SiN film can be formed as the lower mask layer 48, if it can be removed by etching with substantially no damage to the substrate and the electrode. For example, for the lower mask layer 48, an inorganic insulating film such as an $SiO_2$ film, a SiON film, a resist which does not mingle with a negative type resist and accordingly does not change the properties of the negative type resist, an organic insulating film such as a polyimide film or the like, or a conductive film such as a polysilicon film or the like can be used.

Figure 4C:
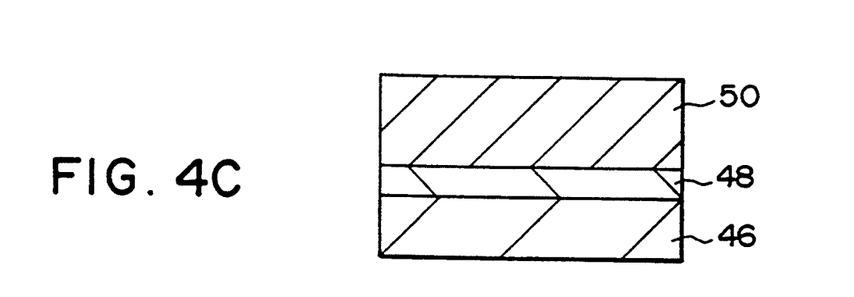

Next, as shown in FIG. 4C, a negative first resist layer 50 having a thickness of about 0.7 μm is applied over the lower mask layer 48. In this embodiment, FSMR (made by Fuji Chemical Manufacturing Co., Ltd) is used for the negative type first resist layer 50.

Figure 4D:
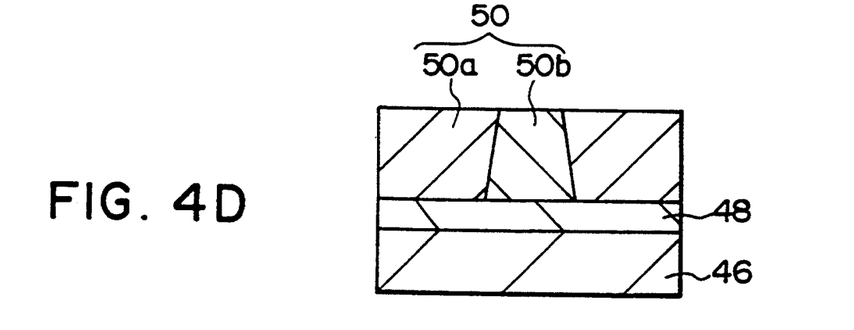

As shown in FIG. 4D, the first resist layer 50 is exposed with the use of the first exposed mask 22 incorporating the phase shifter 26 to form a thin line-like first unexposed part 50b corresponding to the edge 26a of the phase shifter 26 in the first resist layer 50. In this first embodiment, an i-line stepper apparatus RA101VLII (manufactured by Hitachi Manufacturing Co., Ltd) is used as a stepper to set the exposure value for the first resist layer 50 to about 250 mJ.cm$^{-2}$.

Similar to, for example, the unexposed parts 40 and 42 shown in FIG. 3A, an unexposed part for forming a pad (not shown), and an unexposed part 50b for forming a gate electrode are formed in the first resist layer 50. The phase of exposure light having transmitted through the phase shifter 26 on the first exposure mask 22 is shifted from that of exposure light having not transmitted through the phase shifter 26 on the first exposure mask 22 by 180 degree by controlling, for example, the thickness of the phase shifter 26. As a result, the exposure value to a part of the first resist layer 50 corresponding to the edge of the phase shifter 26 is reduced to such a degree that the dissolving characteristic of the edge corresponding part with respect to the developer is not changed, and accordingly, the thin line-like unexposed part 50b, which is not substantially exposed, is formed in this edge corresponding part.

Then, in this embodiment, the first resist layer 50 is exposed with the use of the second exposure mask 30 to form an exposed part for forming a pad (not shown) having a predetermined pattern, and an unexposed part 50b for forming a gate electrode in the first resist layer 50. Specifically, similar to, for example, the unexposed parts 40, 42 shown in FIG. 3(B), the unexposed part for forming a pad having a predetermined shape and the unexposed part 50b for forming a gate electrode having a predetermined shape are formed in the first resist layer 50.

Figure 4E:
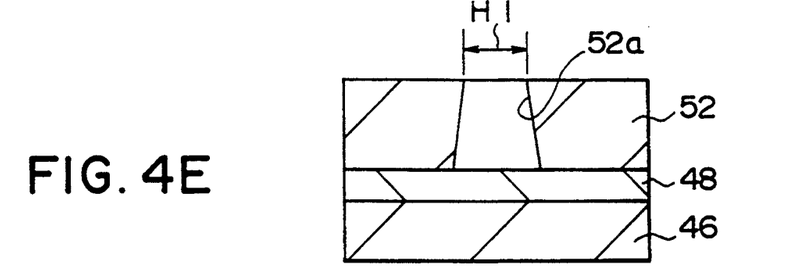

As shown in FIG. 4E, the first resist layer 50 is developed to remove the unexposed part 50b in order to form a first resist pattern 52. In this embodiment, by developing the first resist layer 50 to remove the unexposed part for forming a pad and unexposed part 50b for forming a gate electrode, an aperture for forming a pad (not shown), and an aperture 52a for forming an electrode are formed in the first resist layer 50 to obtain the first resist pattern 52 having these apertures. The lower mask layer 48 is in part exposed through the aperture for forming a pad and the aperture for forming a gate electrode in the first resist pattern 52.

Figure 4F:
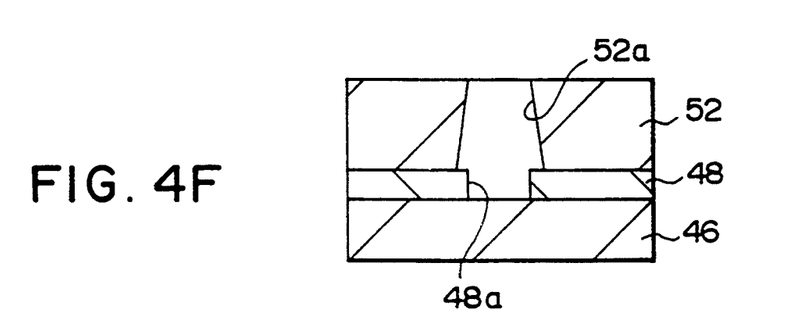

In the case of setting the exposure value to about 250 mJ.cm$^{-2}$ for exposing the first resist layer 50 with the use of the first exposure mask 22, the length H1 of the aperture 52 in the longitudinal direction of the gate electrode can be set to about 0.15 μm. In this case, the longitudinal direction of the gate electrode is orthogonal to the edge of the phase shifter 26. Next, as shown in FIG. 4F, the lower mask layer 48 is etched through the intermediary of the first resist pattern 52 to form a thin line-like aperture 48a in the lower mask layer 48 for exposing the substrate 46. In this embodiment, the lower mask layer 48 is subjected to anisotropic etching, such as reactive ion etching, to form an aperture for forming a pad (not shown) and the aperture 48a for forming a gate electrode.

Figure 4G:
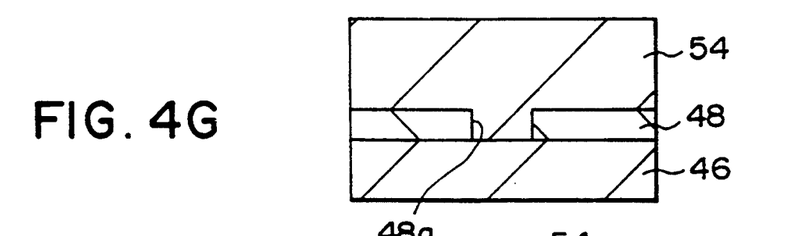

Then, as shown in FIG. 4G, the first resist pattern 52 is removed, and a negative type second resist layer 54 having a thickness of about 0.7 μm is applied over the lower mask layer 48 formed therein with the aperture 48. In this embodiment, FSMR (manufactured by Fuji Chemical Manufacturing Co., Ltd) is used for the second resist layer 54.

Figure 4H:
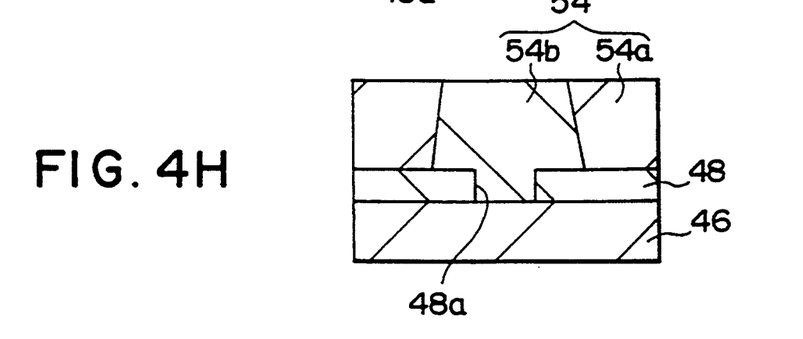

As shown in FIG. 4H, the second resist layer 54 is exposed by an exposure value which is less than that which exposed the first resist layer 51 using the first exposure mask 22 to form a thin line-like second unexposed part 54b which is laid above the aperture 48a formed in the lower mask layer and which is wider than this aperture 48a, in the second resist layer 54. In this embodiment, the stepper used for exposing the first resist layer 50 is used to set the exposure value to, for example, about 100 mJ.cm$^{-2}$ for exposing the second resist layer 54 in order to form an unexposed part for forming a pad (not shown) and the unexposed part 54b for forming a gate electrode in the second resist layer 54. The unexposed part for forming a pad and the unexposed part 54b for forming a gate electrode are formed so that they are superposed with the aperture for forming a pad and the aperture 48a for forming a gate electrode in the lower mask layer 48 as viewed in a plan view. If the exposure value for the second resist layer 54 is set to be smaller than that for the first resist layer 50, the plan view shape of the unexposed part for forming a pad in the second resist layer 54 is substantially the same as that of the unexposed part in the first resist layer 50, corresponding to the first light shield part 24. However, the unexposed part 54 for forming a gate electrode in the second resist layer 54 is wider than the unexposed part for forming a gate electrode, corresponding to the edge of the phase shifter 26, in the first resist layer 50, as viewed in a plan view.

Accordingly, in this case, the length H2 (not shown), in the longitudinal direction of the gate electrode, of an aperture which is formed in the second resist layer 54 by developing and removing the unexposed part for forming a gate electrode is longer than the length H1 of the aperture 52a for forming a gate electrode, formed in the first resist layer 50. If the exposure value for the second resist layer 55 is set to about 100 mJ.cm$^{-2}$, the length H2 of the aperture in the second resist layer 54 can be about a 0.35 μm. This reason will be explained with reference to FIG. 5.

Figure 5:
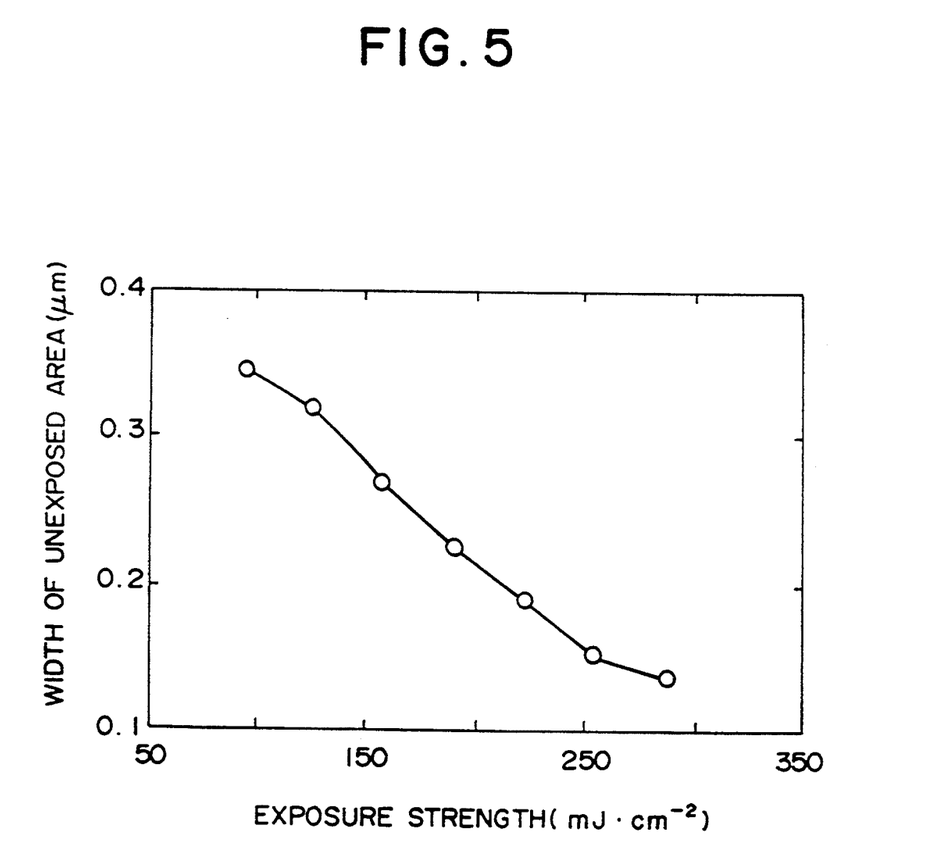
FIG. 5 is a graph showing the relationship between the exposure strength and the aperture width formed in the resist after exposure with the use of the first exposure mask.

FIG. 5 is a graph showing the relationship between the resist exposure value (dose) and the width of an aperture formed in the part corresponding to the edge of the phase shifter in such a case that the resist layer is exposed by the first exposure mask incorporating the phase shifter. In FIG. 5, the ordinate gives the length H2 (μm) of the aperture formed in the part of the resist layer corresponding to the edge of the phase shifter, in the direction orthogonal to the edge of the phase shifter (the longitudinal direction of the gate electrode in this embodiment), and the abscissa gives the exposure strength (mJ.cm$^{-2}$) for the resist layer. It is noted that the relationship between the width of the unexposed part and the exposure strength is detailed in an document, "IEDM Technical Digest", 1990, pages 33.3.1 to 33.3.4.

As understood from FIG. 5, by the exposure for the resist layer with the use of the first exposure mask 22, the length H2 of the aperture formed by developing in the part of the resist layer corresponding to the edge of the phase shifter increases as the exposure value for the resist layer decreases.

Accordingly, even though the first resist layer 50 and the second resist layer 54 are exposed commonly with the use of the first exposure mask 22, the length H2 of the aperture in the second resist layer 54 can be wider than the length H1 of the aperture in the first resist layer 50 by setting the exposure value for the second resist layer 54 to a value which is smaller than that for the first resist layer 50. Since the length H3, in the longitudinal direction of the gate electrode, of the aperture for forming a gate electrode in the lower mask layer 48 is equal to that aperture length H1, the length H2 of the aperture in the second resist layer 54 is longer than the length H3 of the aperture in the lower mask layer 48.

Next, the second resist layer 54 is exposed with the use of the second exposure mask 30 to form an unexposed part having a predetermined pattern for forming a pad (not shown) and an unexposed part 54b for forming a gate electrode in the second resist layer 54. Similar to, for example, the unexposed parts 40 and 42, shown in FIG. 3B, the unexposed part having a predetermined shape for forming a pad and the unexposed part 54b having a predetermined shape for forming a gate electrode are formed in the second resist layer 54.

Figures 4I, 4J:
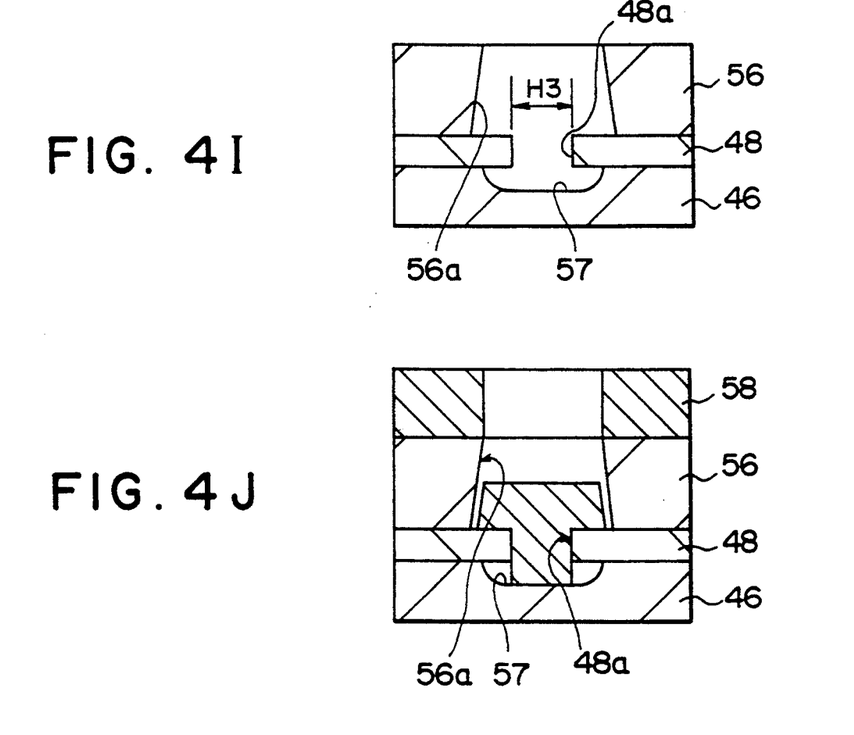

As shown in FIG. 4I, the second resist layer 54 is developed to remove the second unexposed part 54b in order to form a second resist pattern 56 as an upper mask layer for forming an electrode. In this embodiment, by developing the second resist layer 54 to form an aperture for forming a pad (not shown) and an aperture 56a for forming a gate electrode in the second resist layer 54, and therefore, the second resist pattern 56 having these apertures is obtained. The substrate 46 is in part exposed through the apertures for forming a pad and a gate electrode in the second resist pattern 56 and the apertures for forming a pad and a gate electrode in the lower mask layer 48. The second resist pattern will be hereinbelow denoted as an upper mask layer 56.

Next, in this embodiment, a recess 57 is formed in the substrate 46 in a part which is exposed through the upper and lower mask layers 56, 48. The recess 57 having about a depth of about 1,000 Å is formed by for example, wet-etching.

Figure 4K:
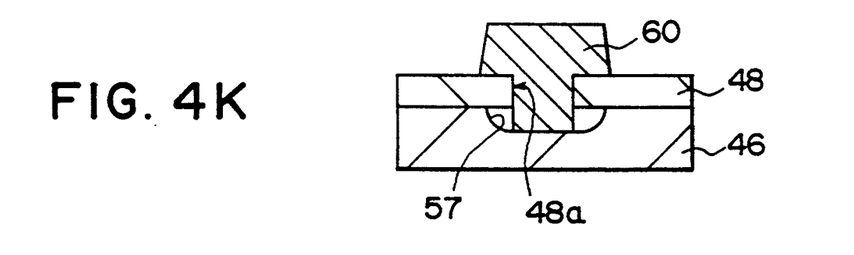
Figure 4L:
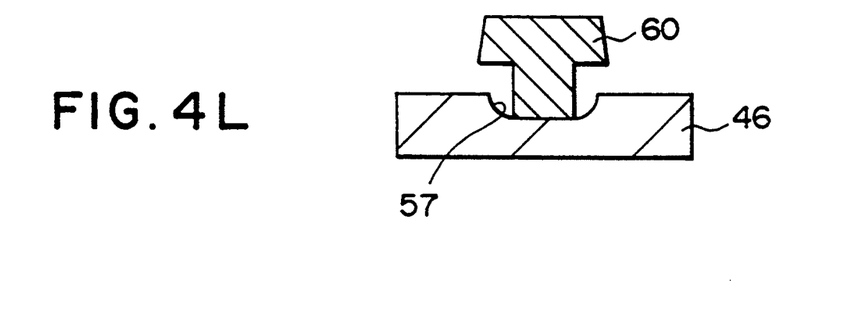

As shown in FIGS. 4J to 4L, after an electrode material 58 is deposited on the substrate 46, the lower mask layer 48 and the upper mask layer 56, the mask layers 48 and 56 are removed. In this embodiment, the electrode material 58 has a double layer structure which is composed of a Ti film and an Al film deposited in that order as viewed from the substrate 46, and the electrode material 58 having the double layer structure is used for an electrode material for forming a gate electrode and a pad. Further, by use of an electron beam deposition under evaporation, a Ti film having a thickness of about 200 Å and an Al film having a thickness of about 500 Å are deposited successively to form the electrode material 58 (FIG. 4J). Then, with the use of an organic solvent, the upper mask layer 56 is removed to lift off the electrode material 58. The electrode material 58 remaining on the substrate 46 constitutes a gate electrode 60 and a pad (not shown) as shown in FIG. 4K. The aperture for forming a gate electrode formed in the upper mask layer 56 is wider than that formed in the lower mask layer 48 as viewed in a plan view, and accordingly, the gate electrode 60 can have a T-like sectional shape. Next, the lower mask layer 48 is removed from the substrate 46 by, for example, plasma etching (FIG. 4L) to complete the formation of the gate electrode 60 and the pad. The gate length of the gate electrode 60 is equal to the length H3 (=H1) of the aperture formed in the lower mask layer 48, which is, for example, about 0.15 μm.

The present invention should not be limited to the above-mentioned embodiment, but various modifications can be made to the configuration of the several components, the shape, the materials used, the numerical conditions, the arrangement positions and the like. The method of forming a T-shaped electrode, according to the present invention can be used for forming T-shaped electrodes for various kinds of electric circuit elements. For example, control electrodes for MESFETs, MEMTs, MOSFETs, diodes or bipolar transistors can be formed as T-shaped electrodes having a fine width. Further, the method of forming a gate electrode and a pad should not be limited to the above-mentioned embodiment. That is, it is possible to eliminate the formation of the recess. Further, the gate electrode and the pad can be formed in respective processes. That is, the light shield parts for forming a pad can be eliminated from the first and second exposure masks for forming a gate electrode in order to form the gate electrode. Further, by forming the gate electrode and the pad in respective processes, a recess is formed in the substrate in an area in which the gate electrode is to be formed. Further, a T-shaped electrode other than the gate electrode can be formed so that the T-shaped electrode is formed by using only the first exposure mask without using the second exposure mask.

As clearly understood from the above-mentioned explanation, with the method of forming a T-shaped electrode according to the present invention, since the phase of exposure light which has transmitted through the phase shifter on the exposure mask differs from that of exposure light which has not transmitted through the phase shifter by about 180 degrees in a projection exposure process, the intensity of light irradiated to the part of the negative resist layer corresponding to the edge of the phase shifter, that is, the edge corresponding pan, is weakened due to the interference of light. Accordingly, since the exposure to the edge corresponding part can be restrained up to a degree such that its dissolving property with respect to the developer is not decreased, an unexposed part which is not substantially exposed can be formed in the edge corresponding part. Further, a fine line-like unexposed part can be formed in this edge corresponding part.

Further, since the width (or area) of the unexposed part formed in the edge corresponding part can be controlled by the exposure strength, an unexposed part in the second resist layer can be wider than an unexposed part in the first resist layer, even with the use of a common exposure mask, by controlling the exposure value. Accordingly, instead of using an electron beam type plotting apparatus, by using a projection exposure process, and in particular, by using reduced scale exposure process, a T-shaped electrode can be formed, thereby it is possible to enhance the productivity. Further, even with the one and the same exposure mask, the width of the unexposed part in the first resist layer can be changed into a desired value by controlling the exposure strength, and accordingly, T-shaped electrode having various widths can be formed by using the technique of controlling the exposure.

What is claimed is:

1. A method of forming a T-shaped electrode comprising the steps of:
    forming a mask layer over a substrate:
    forming a negative type first resist layer over the mask layer;
    exposing the first resist layer through an exposure mask by a first exposure value, the exposure mask including a phase shifter pattern having an edge to form a first thin line-like unexposed pattern corresponding to the edge of the phase shifter pattern onto the first resist layer, the first thin line-like unexposed pattern having a first width;
    developing the first resist layer to remove the first thin line-like unexposed pattern;
    etching the mask layer through the removed first thin line-like pattern to form an aperture which exposes the substrate through the mask layer;
    removing the first resist pattern;
    forming a negative type second resist layer on the mask layer and within the aperture;
    exposing the second resist layer through the exposure mask by a second exposure value, the second exposure value being less than the first exposure value to form a second thin line-like unexposed pattern corresponding to the edge of the phase shifter pattern onto the second resist layer over the aperture, the second unexposed pattern having a second width greater than the first width;
    developing the second resist layer to remove the second thin line-like unexposed pattern to form a mask and substrate structure; and
    depositing an electrode material on the mask and substrate structure; and
    removing the mask layer and the second resist layer to form the T-shaped electrode.

2. A method of manufacturing a T-shaped electrode according to claim 1, wherein a phase of light transmitted through the phase shifter pattern differs from a phase of light not transmitted through the phase shifter pattern by about 180 degrees.

3. A method of manufacturing an electrode having a T-shaped comprising the steps of:
    providing a substrate;
    forming a mask layer on the substrate;
    forming a first negative type resist layer on the mask layer;
    exposing the first resist layer through an exposure mask with a first exposure energy, the exposure mask including a phase shifter pattern having an edge, so that a first unexposed pattern corresponding to the edge of the phase shifter pattern is formed on the first resist layer, the first unexposed pattern having a first width;
    developing the exposed first resist layer to remove the first unexposed pattern for exposing the mask layer;
    etching the mask layer using the first resist layer as a mask to form a first aperture corresponding to the first unexposed pattern exposing the substrate;
    removing the exposed first resist pattern to obtain a structure formed from the substrate and the mask layer having the first aperture;
    forming a second negative type resist layer on the structure obtained by the first resist pattern removing step;
    exposing the second resist layer through the exposure mask with a second exposure energy, the second exposure energy being less than the first exposure energy, so that a second unexposed pattern corresponding to the edge of the phase shifter pattern is formed on the second resist layer over the first aperture, the second unexposed pattern having a second width greater than the first width;
    developing the exposed second resist layer to remove the second unexposed pattern to form a second aperture exposing the substrate through the mask layer and the second resist layer; and
    depositing a material on the substrate within the second aperture to form the electrode having the T-shaped.

4. A method of manufacturing an electrode according to claim 3, wherein a phase of light transmitted through the phase shifter pattern differs from a phase of light not transmitted through the phase shifter pattern by about 180 degrees.

5. A method of manufacturing an electrode according to claim 3, wherein the exposure mask is formed from first and second exposure pattern masks, and the step of exposing the first resist layer further comprises the steps of:

exposing the first resist layer through the first exposure pattern mask with the first exposure energy, the first exposure pattern mask including the phase shifter pattern, so that a first frame line unexposed pattern corresponding to the edge of the phase shifter pattern is formed on the first resist layer; and exposing the first resist layer through a second exposure pattern mask, the second exposure pattern mask including a light shield pattern, so that a part of the first frame line unexposed pattern is covered by the light shield pattern and forms the first unexposed pattern on the first resist layer.

6. A method of manufacturing an electrode according to claim 5, wherein the step of exposing the second resist layer further comprises the steps of:

exposing the second resist layer through the first exposure pattern mask with the second exposure energy so that a second frame line unexposed pattern corresponding to the edge of the phase shifter pattern is formed on the second resist layer over the first aperture; and exposing the second resist layer through the second exposure pattern mask so that a part of the second frame line unexposed pattern is covered by the light shield pattern and forms the second unexposed pattern on the second resist layer.

7. A method of manufacturing a structure having a T-shaped cross section comprising the steps of:

providing a substrate;

forming a mask layer on the substrate;

forming a first negative type resist layer on the mask layer;

exposing the first resist layer through an exposure mask with a first exposure energy, the exposure mask including a phase shifter pattern having an edge so that a first line-like unexposed pattern corresponding to the edge of the phase shifter pattern is formed on the first resist layer, the first line-like unexposed pattern having a first width;

developing the exposed first resist layer to remove the first line-like unexposed pattern so that the mask layer is exposed through the removed first line-like unexposed pattern;

etching the mask layer using the first resist layer as a mask to form a first aperture which exposes the substrate;

removing the first resist pattern;

forming a second negative type resist layer on the first mask layer and the exposed substrate;

exposing the second resist layer through the exposure mask with a second exposure energy, the second exposure energy being less than the first exposure energy so that a second line-like unexposed pattern corresponding to the edge of the phase shifter pattern is formed over the first aperture on the second resist layer, the second line-like unexposed pattern having a second width greater that the first width;

developing the exposed second resist layer to remove the second line-like unexposed pattern so that the first mask layer and the substrate are exposed through the removed second line-like unexposed pattern; and depositing a material of the structure on said substrate within the removed second line-like unexposed pattern to form a structure having the T-shaped cross section.

8. A method of manufacturing a structure according to claim 7, wherein a phase of light transmitted through the phase shifter pattern differs from a phase of light not transmitted through the phase shifter pattern by about 180 degrees.

9. A method of manufacturing a structure according to claim 7, wherein the structure is an electrode.

10. A method of manufacturing a structure according to claim 7, wherein the step of exposing the first resist layer comprises the steps of:

exposing the first resist layer through a first exposure mask including a phase shifter pattern having an edge with the first exposure energy so that a first frame line unexposed pattern corresponding to the edge of the phase shifter pattern is formed on the first resist layer; and further exposing the first resist layer through a second exposure mask including a light shield pattern so that a part of the first frame line unexposed pattern is covered by the light shield pattern to form the first line-like unexposed pattern on the first resist layer.

11. A method of manufacturing a structure according to claim 10, wherein the step of exposing the second resist layer comprises the steps of:

exposing the second resist layer through the first exposure mask with the second exposure energy so that the second frame line unexposed pattern corresponding to the edge of the phase shifter pattern is formed over the first aperture on the second resist layer, a width of the second unexposed pattern being wider than that of the first unexposed pattern; and further exposing the second resist layer through the second exposure mask so that a part of the second frame line unexposed pattern is covered by the light shield pattern to form the second line-like unexposed pattern on the second resist layer.

* * * * *